(12) United States Patent
Seki et al.

(10) Patent No.: US 11,888,408 B2
(45) Date of Patent: Jan. 30, 2024

(54) POWER CONVERSION DEVICE AND MANUFACTURING METHOD OF POWER CONVERSION DEVICE

(71) Applicant: Hitachi Astemo, Ltd., Hitachinaka (JP)

(72) Inventors: Takeshi Seki, Hitachinaka (JP); Ayumu Hatanaka, Hitachinaka (JP); Naoya Suto, Hitachinaka (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 297 days.

(21) Appl. No.: 17/439,044

(22) PCT Filed: Jan. 30, 2020

(86) PCT No.: PCT/JP2020/003315
§ 371 (c)(1),
(2) Date: Sep. 14, 2021

(87) PCT Pub. No.: WO2020/195141
PCT Pub. Date: Oct. 1, 2020

(65) Prior Publication Data
US 2022/0158566 A1 May 19, 2022

(30) Foreign Application Priority Data

Mar. 27, 2019 (JP) ................................. 2019-060436

(51) Int. Cl.
*H02M 7/53* (2006.01)
*H02M 7/00* (2006.01)
(Continued)

(52) U.S. Cl.
CPC ............ *H02M 7/003* (2013.01); *H01L 23/34* (2013.01); *H02M 7/537* (2013.01); *H05K 7/1432* (2013.01); *H05K 7/209* (2013.01)

(58) Field of Classification Search
CPC ....... H02M 7/003; H02M 7/537; H01L 23/34; H05K 7/1432; H05K 7/209
See application file for complete search history.

(56) References Cited

U.S. PATENT DOCUMENTS

| 2015/0049533 A1 | 2/2015 | Nishikimi et al. | |
| 2015/0382501 A1* | 12/2015 | Horiuchi | H05K 7/2089 363/131 |

(Continued)

FOREIGN PATENT DOCUMENTS

| JP | 2013-169070 A | 8/2013 |
| JP | 2014-171343 A | 9/2014 |

(Continued)

OTHER PUBLICATIONS

International Search Report with English translation and Written Opinion issued in corresponding application No. PCT/JP2020/003315 dated Apr. 7, 2020.

*Primary Examiner* — Adolf D Berhane
(74) *Attorney, Agent, or Firm* — Foley & Lardner LLP

(57) ABSTRACT

A negative-side bus bar 41 includes a capacitor connection portion and first and second negative terminal portions 271 exposed from a resin portion 44 and connected to a DC negative-side terminals 103 of first and second power semiconductor modules 30. A partition portion 252b of a case 252 is provided with a protruding portion 281 that protrudes toward a mold bus bar 40 further than an upper surface 257 of the first and second power semiconductor modules 30 and is thermally coupled to the mold bus bar 40. The projecting portion 281 is disposed between a root portion 275 of an exposed portion where the first negative electrode terminal portion 271 is exposed from the resin portion 44 and a second root portion 275 of an exposed portion where the second negative electrode terminal portion 271 is exposed from the resin portion 44. In this manner, a spatial distance (Continued)

and a creepage distance between the exposed portion from the resin portion of the mold bus bar and the power semiconductor module are made large and the temperature rise of a capacitor is suppressed.

7 Claims, 13 Drawing Sheets

(51) Int. Cl.
*H01L 23/34* (2006.01)
*H02M 7/537* (2006.01)
*H05K 7/14* (2006.01)
*H05K 7/20* (2006.01)

(56) References Cited

U.S. PATENT DOCUMENTS

| | | |
|---|---|---|
| 2017/0353118 A1 | 12/2017 | Hara et al. |
| 2019/0159367 A1 | 5/2019 | Umino |
| 2022/0368242 A1* | 11/2022 | Murakami .......... H02M 7/5387 |
| 2023/0163693 A1* | 5/2023 | Awamori .............. H02M 1/327 |
| | | 363/13 |

FOREIGN PATENT DOCUMENTS

| | | |
|---|---|---|
| WO | WO-2016/132851 A1 | 8/2016 |
| WO | WO-2017/187598 A1 | 11/2017 |

* cited by examiner

POWER CONVERSION DEVICE AND MANUFACTURING METHOD OF POWER CONVERSION DEVICE

TECHNICAL FIELD

The present invention relates to a power conversion device and a manufacturing method of the power conversion device.

BACKGROUND ART

A power conversion device for driving a vehicle such as a hybrid vehicle or an electric car is configured such that, for example, a three-phase power semiconductor module and a smoothing capacitor constituting an inverter circuit are housed in a case constituting a flow path forming body. An input/output terminal and a smoothing capacitor of a power semiconductor module are connected to, for example, a mold bus bar, and a signal terminal is connected to a control circuit board.

As an example of such a power conversion device, a structure in which a mold bus bar is directly mounted on an entire flat surface of a flow path forming body is known. A terminal portion connected to the input/output terminal of the power semiconductor module of the mold bus bar is exposed from a resin portion on the opposite surface side of the flow path forming body. The mold bus bar and the flow path forming body are disposed in contact with each other, and a surface in contact with the flow path forming body of the mold bus bar is covered with a resin portion constituting the mold bus bar. It is described as follows: according to this structure, heat transferred from the power semiconductor module to the mold bus bar is cooled by the flow path forming body, so that the temperature of the bus bar can be lowered (see, for example, PTL 1).

CITATION LIST

Patent Literature

PTL 1: JP 2014-171343 A

SUMMARY OF INVENTION

Technical Problem

In the structure described in PTL 1, the mold bus bar is directly mounted on the entire flat surface of the flow path forming body and coupled to the flow path forming body so as to be capable of conducting heat. Therefore, the spatial distance from the flat surface of the flow path forming body to a root portion (hereinafter, the terminal portion exposed root portion) exposed from a resin portion of a bus bar terminal portion is substantially equal to the thickness of the mold bus bar. Further, since the bus bar and the flow path forming body are connected to each other at a position immediately below the terminal portion exposed root portion of the bus bar, the distance along the flat surface of the flow path forming body in the creepage distance from the terminal portion exposed root portion of the bus bar to the flow path forming body is substantially zero. Therefore, the creepage distance from the terminal portion exposed root portion of the bus bar to the flow path forming body is also substantially equal to the thickness of the mold bus bar. That is, the spatial distance and the creepage distance from the terminal portion exposed root portion of the bus bar to the flow path forming body are a short distance substantially equal to the thickness of the bus bar mold. For this reason, there has been possibility that the temperature of the bus bar becomes high due to the heat generated by the power semiconductor module, the temperature of the smoothing capacitor rises, and the temperature of the smoothing capacitor exceeds the heat-resistant temperature.

Solution to Problem

According to a first aspect of the present invention, there is provided a power conversion device including a capacitor, a first power semiconductor module and a second power semiconductor module each having an input terminal or an output terminal protruding from one surface, a case including a capacitor housing portion that houses the capacitor, a semiconductor module housing portion that houses the first power semiconductor module and the second power semiconductor module, and a partition portion provided between the first power semiconductor module and the second power semiconductor module, and a connection member in which a resin portion and a connection conductor are integrally provided and which is disposed on the one surface of the first power semiconductor module and the second power semiconductor module. The connection conductor includes a capacitor connection portion connected to the capacitor, a first terminal portion exposed from the resin portion and connected to the terminal of the first power semiconductor module, and a second terminal portion connected to the terminal of the second power semiconductor module, the partition portion of the case is provided with a protruding portion that protrudes toward the connection member further than the one surface of the first power semiconductor module and the second power semiconductor module and is thermally coupled to the connection member, and the protruding portion is thermally coupled to the connection member and disposed between a first root portion of an exposed portion where the first terminal portion is exposed from the resin portion and a second root portion of an exposed portion where the second terminal portion is exposed from the resin portion.

According to a second aspect of the present invention, there is provided a manufacturing method of a power conversion device, the manufacturing method including housing a capacitor in a capacitor housing portion of a case, and housing, on both sides of a partition portion of the case, a first power semiconductor module and a second power semiconductor module each having an input terminal or an output terminal protruding from one surface in a semiconductor module housing portion of the case provided with the partition portion, and disposing, on the one surface of the first power semiconductor module and the second power semiconductor module, a connection member in which a resin portion and a connection conductor are integrally provided, and the connection conductor has a capacitor connection portion connected to the capacitor and has a first terminal portion exposed from the resin portion and connected to the terminal of the first power semiconductor module and a second terminal portion connected to the terminal of the second power semiconductor module. The partition portion is provided with a protruding portion that protrudes toward the connection member side further than the one surface of the first power semiconductor module and the second power semiconductor module and is thermally coupled to the connection member, and the disposing the connection member on the one surface of the first power semiconductor module and the second power semiconductor module includes disposing the protruding portion between a first root portion of an exposed portion where the first terminal portion is exposed from the resin portion and a second root portion of an exposed portion where the second terminal portion is exposed from the resin portion, and thermally coupling the protruding portion to the connection member.

Advantageous Effects of Invention

According to the present invention, a spatial distance and a creepage distance between an exposed portion from a resin portion of a connection member and a power semiconductor module can be made large and a temperature rise of a capacitor can be suppressed.

DESCRIPTION OF EMBODIMENTS

Hereinafter, an embodiment of a power conversion device of the present invention will be described with reference to the drawings.

Figure 1:
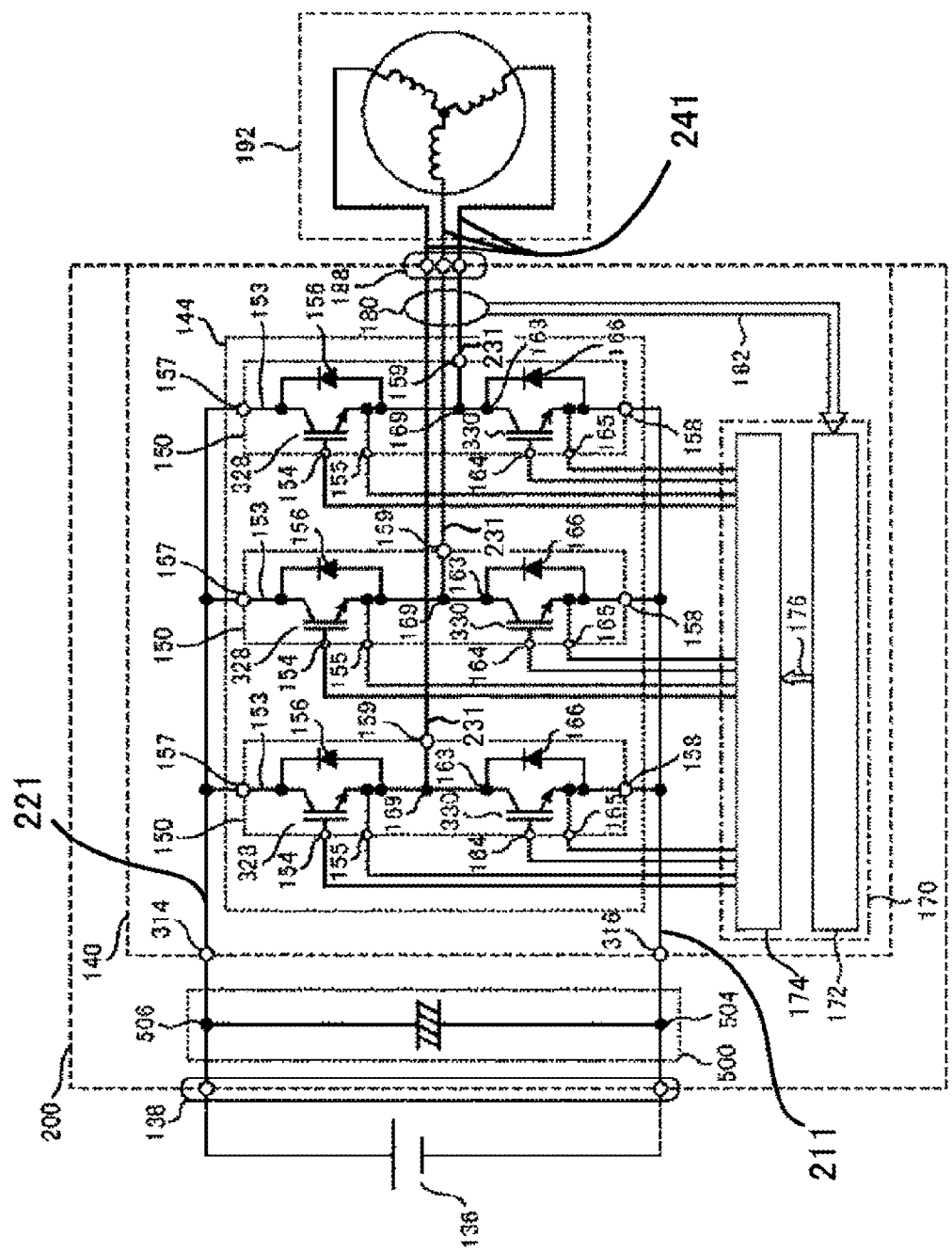
FIG. 1 is a diagram illustrating an example of a circuit diagram of a power conversion device of the present invention.

FIG. 1 is a diagram illustrating an example of a circuit diagram of the power conversion device of the present invention.

The power conversion device of the present invention can be applied to a hybrid car or a pure electric car. Further, the power conversion device of the present invention is suitable as a power conversion device for driving a vehicle such as an automobile or a truck, and can also be applied to a power conversion device other than these, for example, a power conversion device for an electric train, a ship, an aircraft, or the like, an industrial power conversion device used as a control device for an electric motor that drives a factory facility, or a domestic power conversion device used for a control device for an electric motor that drives a domestic photovoltaic power generation system or household electric appliances.

A power conversion device 200 includes an inverter device 140 and a capacitor module 500 for smoothing. A battery 136 is electrically connected to the inverter device 140. The capacitor module 500 provided between the battery 136 and the inverter device 140 smooths the direct current. The capacitor module 500 for smoothing has a positive-side capacitor terminal 506 and a negative-side capacitor terminal 504. The capacitor module 500 for smoothing is electrically connected to the battery 136 via a DC connector 138. The inverter device 140 is connected to the positive-side capacitor terminal 506 via a DC positive-side terminal 314, and is connected to the negative-side capacitor terminal 504 via a DC negative-side terminal 316.

The inverter device 140 includes an inverter circuit 144 and a control unit 170. The control unit 170 includes a driver circuit 174 that drives and controls the inverter circuit 144, and a control circuit 172 that supplies a control signal to the driver circuit 174 via a signal line 176. A motor generator 192 is connected to an output side of the inverter device 140.

In the inverter circuit 144, an upper and lower arm series circuit 150 including an IGBT 328 and a diode 156 operating as an upper arm and an IGBT 330 and a diode 166 operating as a lower arm is provided for three phases (U-phase, V-phase, W-phase) corresponding to phase windings of an armature winding of the motor generator 192. Here, the IGBT is an abbreviation of an insulated gate bipolar transistor. Each of the upper and lower arm series circuits 150 has an AC terminal 159 connected to a midpoint portion (intermediate electrode 169) of the upper and lower arm series circuit 150. The AC terminal 159 is connected to an AC connector 188 by an AC output-side connection conductor 231. Further, the AC connector 188 is connected to the motor generator 192 by a relay AC connection conductor 241.

A collector electrode 153 of the IGBT 328 of the upper arm is electrically connected to the positive-side capacitor terminal 506 of the capacitor module 500 via a positive electrode terminal 157 by a DC positive-side connection conductor 221. An emitter electrode of the IGBT 330 of the lower arm is electrically connected to the negative-side capacitor terminal 504 of the capacitor module 500 via a negative electrode terminal 158 by a DC negative-side connection conductor 211.

The control unit 170 includes a driver circuit 174 that drives and controls the inverter circuit 144, and a control circuit 172 that supplies a control signal to the driver circuit 174 via a signal line 176. The IGBT 328 and the IGBT 330 operate in response to a drive signal output from the control unit 170, and convert DC power supplied from the battery 136 into three-phase AC power. The converted power is supplied to an armature winding of the motor generator 192.

The IGBT 328 includes the collector electrode 153, a gate electrode 154, and a signal emitter electrode 155. The IGBT 330 includes a collector electrode 163, a signal emitter electrode 165, and a gate electrode 164. The diode 156 is electrically connected in parallel with the IGBT 328. The diode 166 is electrically connected in parallel with the IGBT 330. As a power semiconductor element for switching, a metal oxide semiconductor field effect transistor (MOSFET) may be used. However, in this case, the diode 156 and the diode 166 are unnecessary.

The control circuit 172 includes a microcomputer (hereinafter, described as "microcomputer") for calculating a switching timing of the IGBTs 328 and 330. A target torque value required for the motor generator 192, a current value supplied from the upper and lower arm series circuit 150 to the armature winding of the motor generator 192, and a magnetic pole position of a rotor of the motor generator 192 are input to the microcomputer as input information. The target torque value is based on a command signal output from a high-order control device (not shown). The current value is detected based on a detection signal output from a current sensor 180 via a signal line 182. The magnetic pole position is detected based on a detection signal output from a rotating magnetic pole sensor (not shown) provided in the motor generator 192. In the present embodiment, a case where current values of three phases are detected will be described as an example. However, current values of two phases may be detected.

Figure 2:
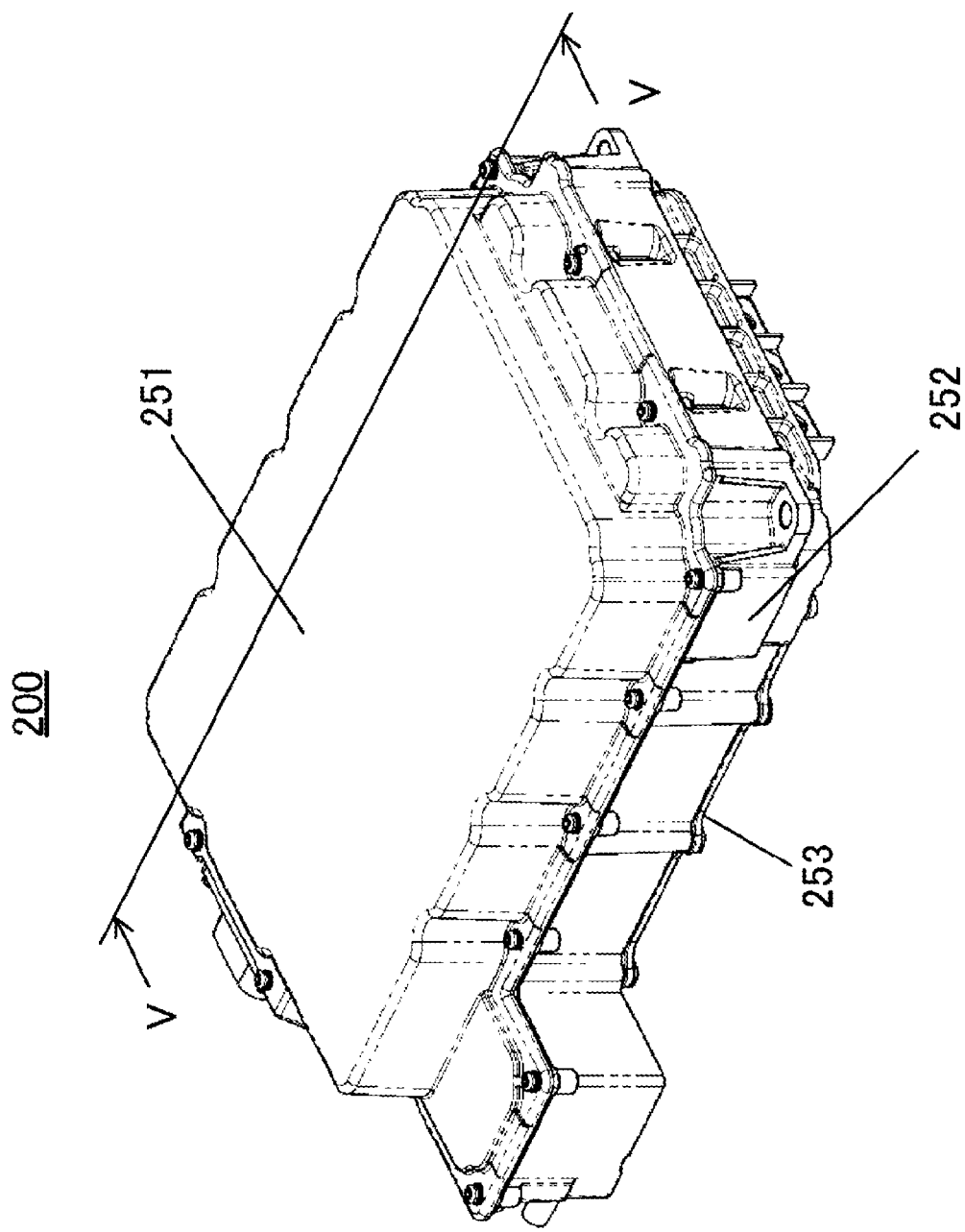
FIG. 2 is an external perspective view of the power conversion device according to an embodiment of the present invention.
Figure 3:
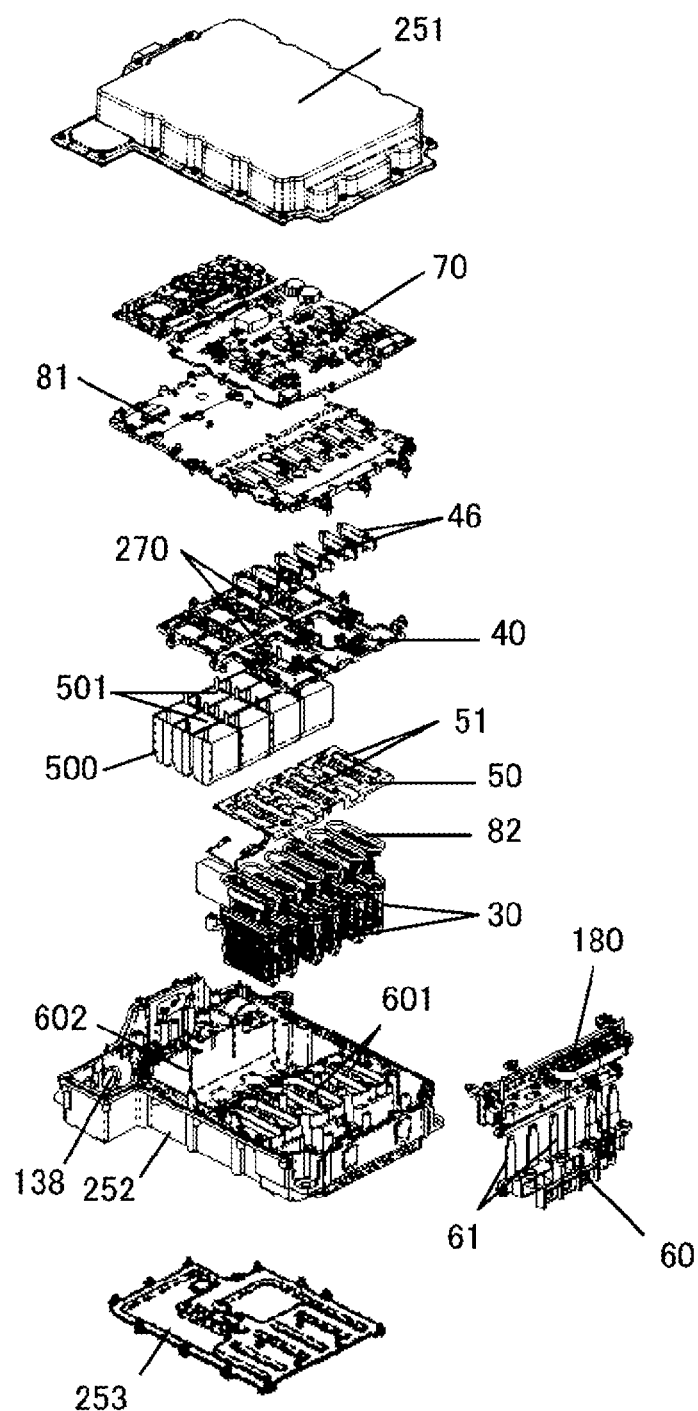
FIG. 3 is an exploded perspective view of the power conversion device illustrated in FIG. 2.

FIG. 2 is an external perspective view of the power conversion device according to an embodiment of the present invention, and FIG. 3 is an exploded perspective view of the power conversion device illustrated in FIG. 2.

As illustrated in FIG. 2, the power conversion device 200 has a substantially rectangular parallelepiped housing including a cover 251, a case 252, and a water path cover 253. Each of the cover 251, the case 252, and the water path cover 253 is made from metal such as an aluminum alloy.

As illustrated in FIG. 3, six of the power semiconductor modules 30, the capacitor module 500, a mold bus bar 40, a metal member 50, a control circuit board 70, a board base 81, the current sensor 180, and an AC terminal member 60 are housed in a space formed by the cover 251 and the case 252. In the case 252, a semiconductor module housing portion 601 that houses the six power semiconductor modules 30 and a capacitor module housing portion 602 that houses the capacitor module 500 are formed. In the case 252, a flow path (not shown) for cooling the six power semiconductor modules 30 housed in the semiconductor module housing portion 601 is formed, and the case 252 has a function as a flow path forming body.

The water path cover 253 covers a lower surface on the opposite side of the cover 251 side of the case 252, and is attached to the case 252 in a watertight manner. An input/output pipe (not shown) is inserted into water path cover 253, and a refrigerant such as cooling water is supplied to the flow path of the case 252 through the water path cover 253.

The current sensor 180 and the AC terminal member 60 are attached to the facing surface side of one side surface of the cover 251.

Each of the power semiconductor modules 30 has a module case 31 (see FIG. 6) and a terminal portion 33 (see FIG. 7), and a sealing material 82 (see also FIG. 6) is wound around the outer periphery of the module case 31. The metal member 50 is disposed above each of the power semiconductor modules 30. The metal member 50 is provided with six openings 51 through which the terminal portions 33 of the power semiconductor modules 30 are inserted.

The mold bus bar 40 is disposed on the capacitor module 500 housed in the capacitor module housing portion 602 of the case 252 and the power semiconductor module 30 housed in the semiconductor module housing portion 601. The mold bus bar 40 includes a large number of connection terminal portions 270 (see FIG. 9).

The control circuit board 70 is disposed on the inner side of the cover 251. An electronic component constituting the control unit 170 illustrated in FIG. 1 is mounted on the control circuit board 70. The control circuit board 70 is held by the board base 81. The board base 81 is fixed to a boss portion provided on the case 252 by a fastening member (not shown).

Figure 4:
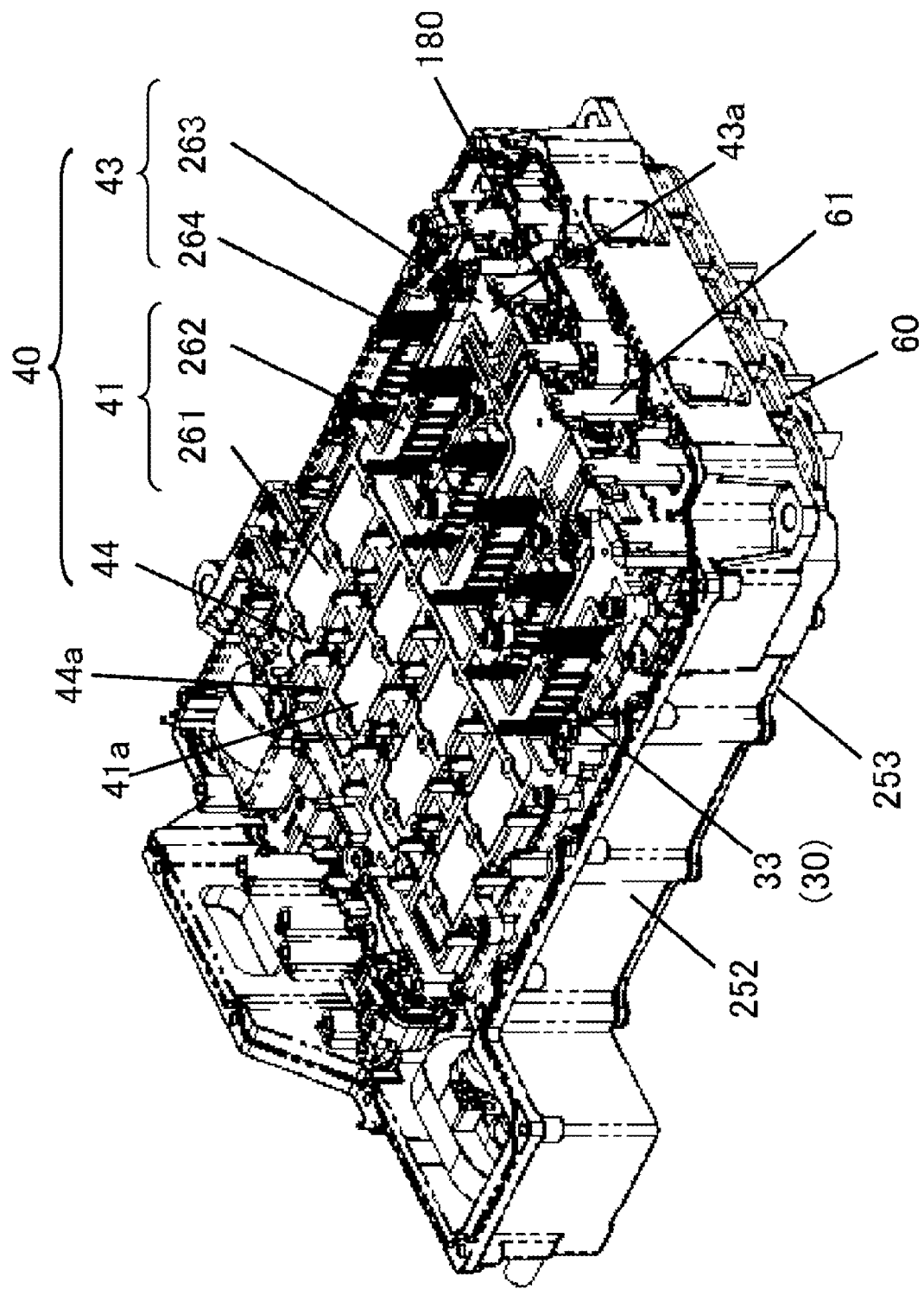
FIG. 4 is a perspective view of a state in which a capacitor module, a power semiconductor module, and a mold bus bar are housed in a case illustrated in FIG. 3.
Figure 5:
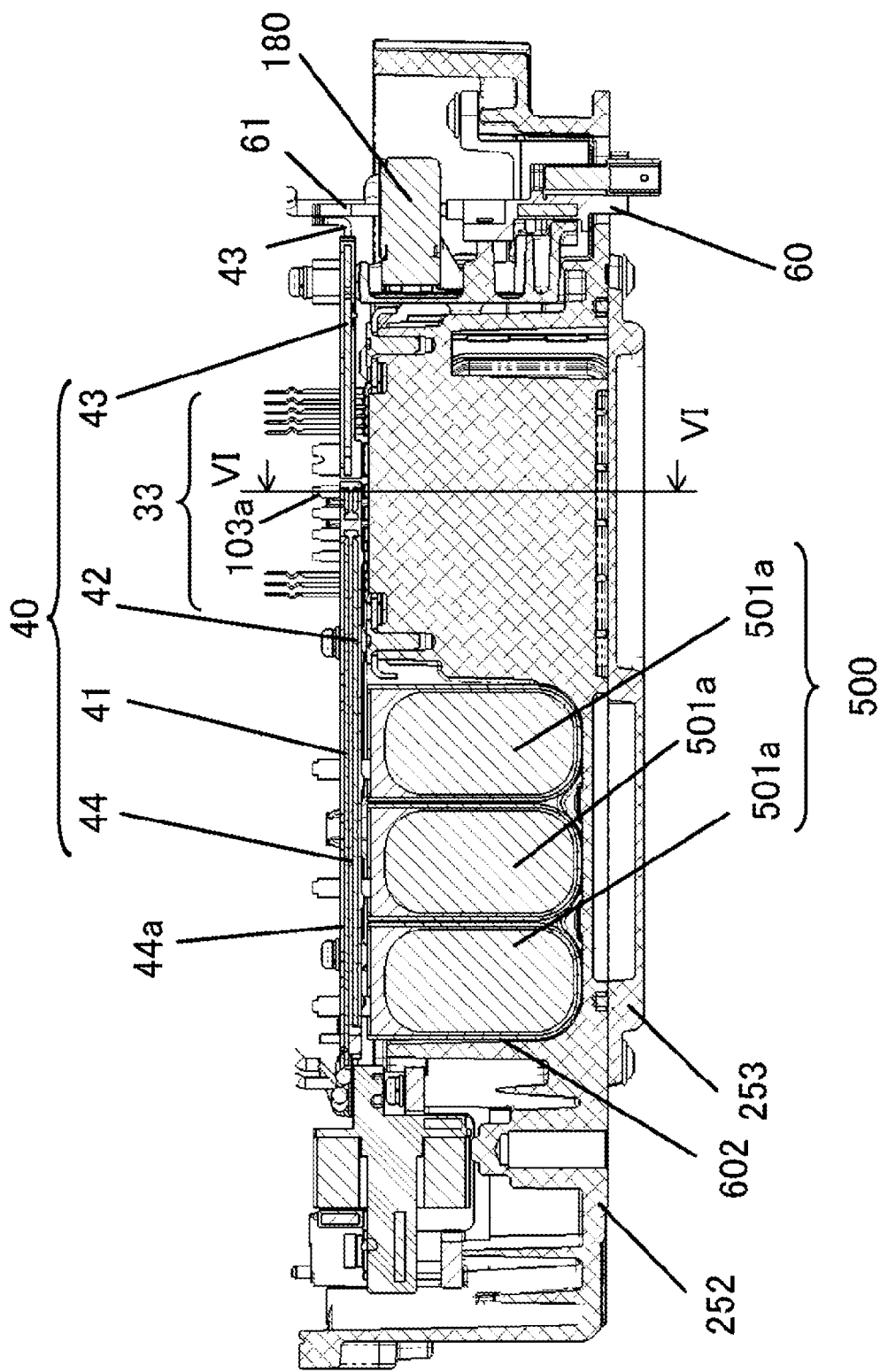
FIG. 5 is a cross-sectional view taken along line V-V of the power conversion device illustrated in FIG. 2.

FIG. 4 is a perspective view of a state in which a capacitor module, a power semiconductor module, and a mold bus bar are housed in the case illustrated in FIG. 3, and FIG. 5 is a cross-sectional view taken along line V-V of the power conversion device illustrated in FIG. 2. However, in FIG. 5, the cover 251, the control circuit board 70, the board base 81, and the insulating material 46 illustrated in FIG. 1 are not illustrated.

As described above, the mold bus bar 40 is fixed to the case 252 by the fastening member above the capacitor module 500 housed in the case 252 and above the power semiconductor module 30. The metal member 50 is interposed between the power semiconductor module 30 and the mold bus bar 40 (see FIG. 6). The capacitor module 500 includes a plurality (exemplified as twelve in FIG. 3) of capacitor elements 501.

As shown in FIG. 5, the mold bus bar 40 includes a resin portion 44, a negative-side bus bar 41, a positive-side bus bar 42, and an AC-side bus bar 43. That is, the mold bus bar 40 is a member formed by insert molding using the negative-side bus bar 41, the positive-side bus bar 42, and the AC-side bus bar 43 as insert members. The neaative-side bus bar 41, the positive-side bus bar 42, and the AC-side bus bar 43 correspond to the DC negative-side connection conductor 211, the DC positive-side connection conductor 221, and the AC output-side connection conductor 231 in FIG. 1, respectively. The negative-side bus bar 41 and the positive-side bus bar 42 are connected to each of the capacitor elements 501 housed in the capacitor module housing portion 602. Further, the negative-side bus bar 41, the positive-side bus bar 42, and the AC-side bus bar 43 are connected to the terminal portions 33 of the power semiconductor modules 30. Note that the terminal portion 33 includes a plurality of power supply terminals and a plurality of signal terminals, which will be described later in detail.

As illustrated in FIG. 5, the current sensor 180 and the AC terminal member 60 are attached to the case 252. A relay AC bus bar 61 (see also FIG. 13) is attached to the AC terminal member 60. The relay AC bus bar 61 corresponds to the relay AC connection conductor 241 of FIG. 1. The relay AC bus bar 61 extends in the vicinity of the current sensor 180 and is connected to the AC-side bus bar 43.

Each of the negative-side bus bar 41 and the AC-side bus bar 43 has a plurality of exposed portions 41a and 43a (see FIG. 4) exposed from the resin portion 44. As shown in FIG. 4, each of the exposed portion 41a of the negative-side bus bar 41 and the exposed portion 43a of the AC-side bus bar 43 is recessed to the internal side from an upper surface 44a of the resin portion 44. In other words, there is a gap between the upper surface 44a of the resin portion 44 and the exposed portion 41a of the negative-side bus bar 41 or the exposed portion 43a of the AC-side bus bar 43. In contrast, upper and lower surfaces of the positive-side bus bar 42 and a lower surface of AC-side bus bar 43 are covered with the resin portion 44.

Figure 7A:
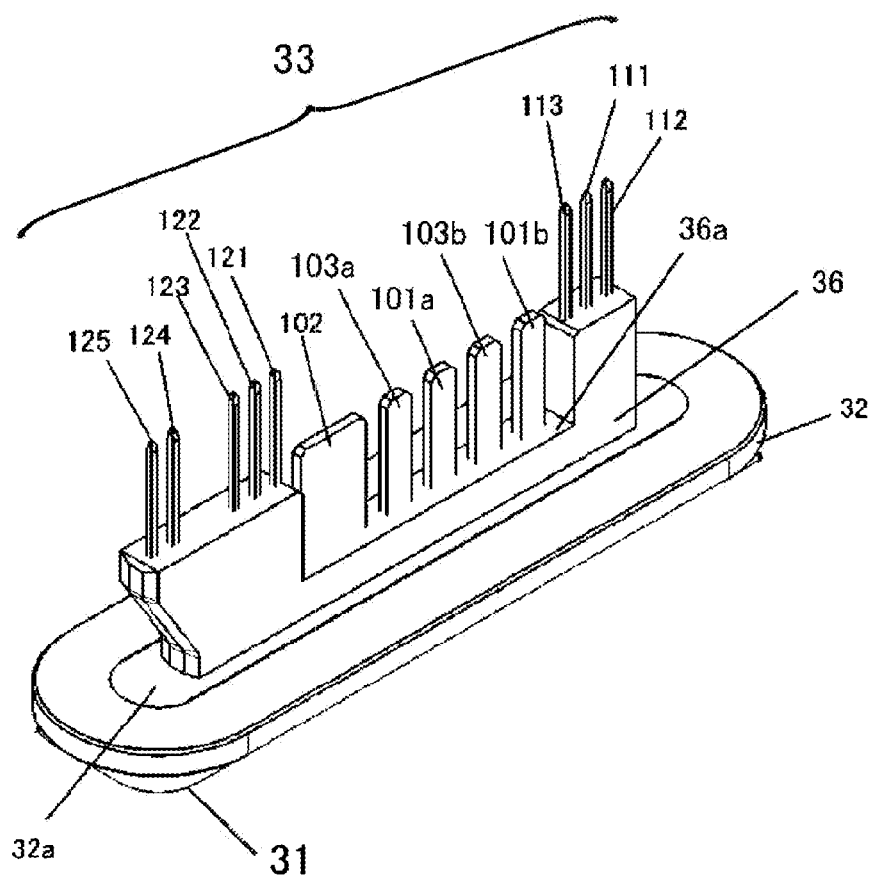
FIG. 7(A) is an enlarged perspective view of the periphery of a terminal portion of the power semiconductor module illustrated in FIG. 5.
Figure 7B:
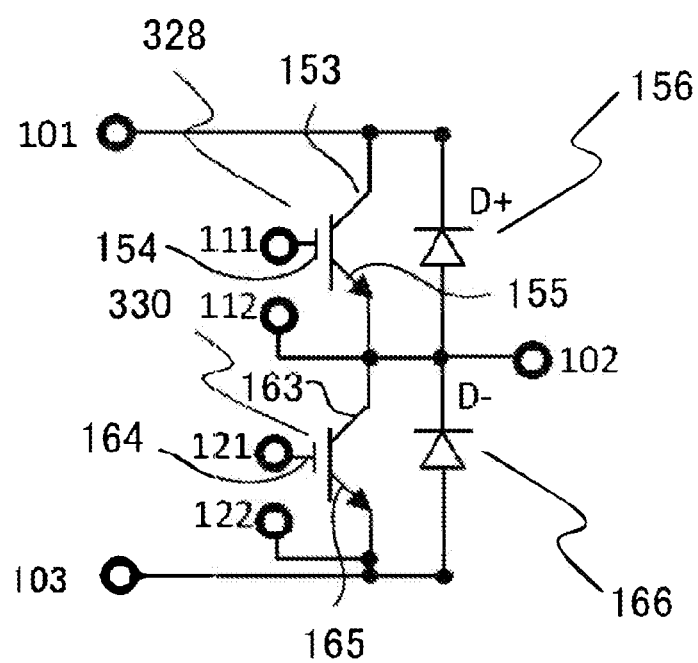
FIG. 7(B) is a circuit diagram illustrating an example of a circuit incorporated in a power semiconductor module 30.

FIG. 7(A) is an enlarged perspective view of the periphery of a terminal portion of the power semiconductor module illustrated in FIG. 5, and FIG. 7(B) is a circuit diagram illustrating an example of a circuit incorporated in the power semiconductor module 30.

The power semiconductor module 30 has the terminal portion 33 protruding to the outside from the module case 31. The terminal portion 33 includes a plurality of power supply terminals and a plurality of signal terminals described below.

As illustrated in FIG. 7(B), the power semiconductor module 30 incorporates two of the IGBTs 328 and 330 and two of the diodes 156 and 166. The IGBT 328 and the diode 156 constitute an upper arm circuit. The IGBT 330 and the diode 166 constitute a lower arm circuit.

A DC positive-side terminal 101 is connected to the collector electrode 153 of the IGBT 328 and the cathode electrode of the diode 156. A DC negative-side terminal 103 is connected to the emitter electrode 165 of the IGBT 330 and the anode electrode of the diode 166. The DC positive-side terminal 101 is formed to be branched into two as branch terminals 101a and 101b, and is electrically connected inside the power semiconductor module 30. The DC negative-side terminal 103 is formed to be branched into two as branch terminals 103a and 103b, and is electrically connected inside the power semiconductor module 30.

To a connection point at which the emitter electrode 155 of the IGBT 328 and the collector electrode 163 of the IGBT 330 are connected, a connection point of the anode electrode of the diode 156 and the cathode electrode of the diode 166 is connected, and also an AC output terminal 102 is connected.

The gate electrodes 154 and 164 of the IGBTs 328 and 330 are connected to gate terminals 111 and 121 as signal terminals, respectively, and the emitter electrodes 155 and 165 of the IGBTs 328 and 330 are connected to emitter terminals 112 and 122 as signal terminals, respectively.

The gate terminals 111 and 121 and the emitter terminals 112 and 122 are connected to the control unit 170 (see FIG. 1).

Note that, in FIG. 7(A), four signal terminals 113 and 123 to 125 not illustrated in FIG. 7(B) are terminals for sensor signals for detecting overcurrent and overtemperature of the IGBTs 328 and 330.

Figure 6:
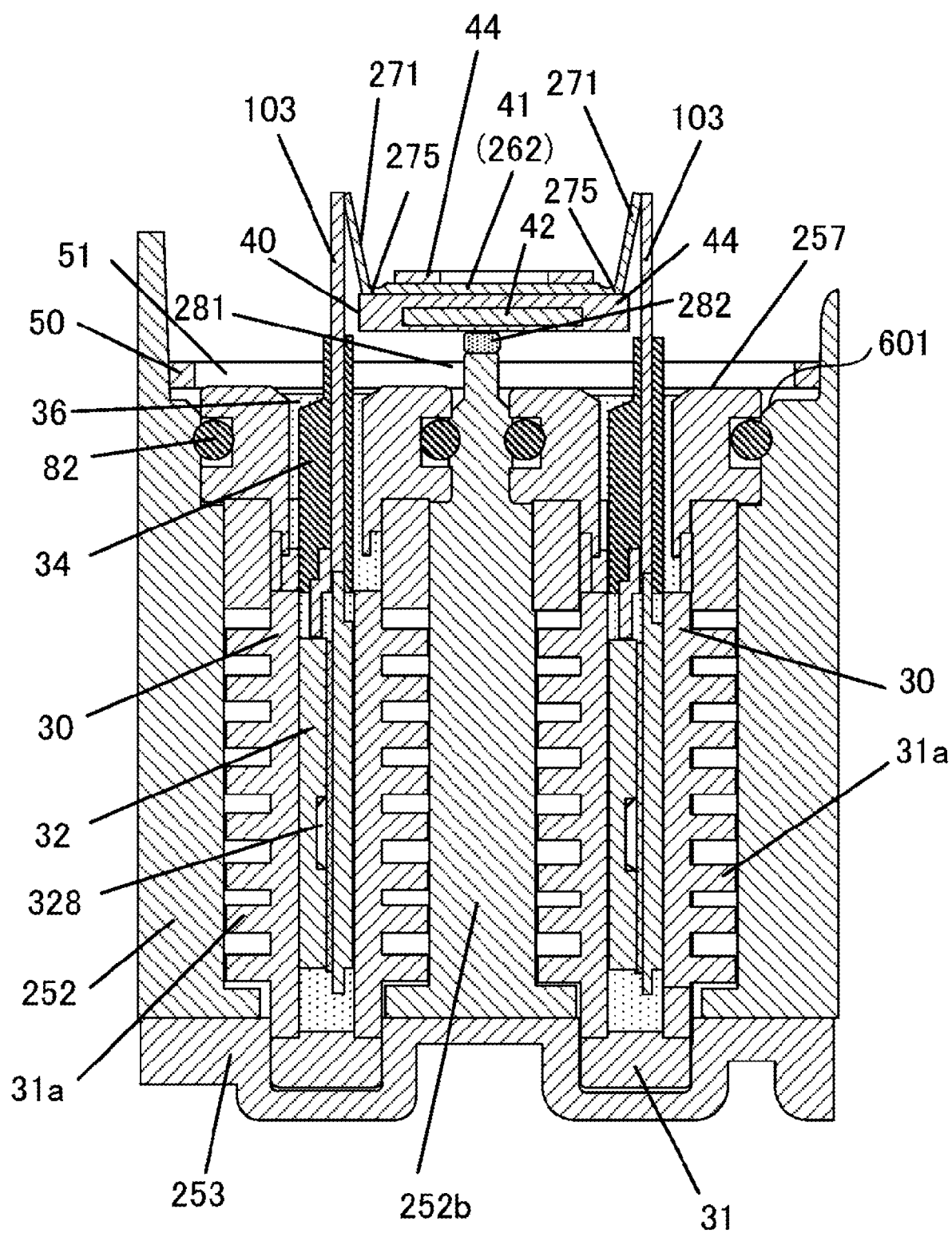
FIG. 6 is a cross-sectional view of a partial region of line VI-VI of the power conversion device illustrated in FIG. 5.

FIG. 6 is a cross-sectional view of a partial region of line VI-VI of the power conversion device illustrated in FIG. 5.

The case 252 is provided with a semiconductor module housing portion 601 that houses the power semiconductor module 30. In the case 252, a partition portion 252b is provided in the semiconductor module housing portion 601. The power semiconductor module 30 is housed on both sides of the partition portion 252b of the semiconductor module housing portion 601. The power semiconductor module 30 includes the module case 31 made from metal having a plurality of heat dissipation fins 31a. In the module case 31, an electronic component constituent 32 in which the IGBTs 328 and 330 and the diodes 156 and 166 (FIG. 6 illustrates only the IGBT 328) are integrated by resin is housed. Further, in the module case 31, a terminal assembly 34 having the terminal portion 33 illustrated in FIG. 7 is housed. The electronic component constituent 32 and the terminal assembly 34 are fixed in the module case 31 by resin 36 with which the module case 31 is filled.

The metal member 50 is disposed on the power semiconductor module 30. The metal member 50 is fixed to the case 252 by a fastening member (not shown), and presses and fixes the power semiconductor module 30 against the water path cover 253 fixed to a bottom portion of the case 252. Although not illustrated, the metal member 50 is preferably formed to have a corrugated cross-sectional shape to have elasticity, and caused to press the power semiconductor module 30 against the water path cover 253 with the elastic force of the metal member 50.

Note that a structure in which the power semiconductor module 30 is held on the bottom portion of the case 252 may also be employed.

A flow path through which a refrigerant such as cooling water flows is formed in the semiconductor module housing portion 601 housing the power semiconductor module 30. The sealing material 82 is interposed between the module case 31 and the case 252, and the module case 31 and the case 252 have a watertight structure.

The mold bus bar 40 is disposed above the metal member 50 with a gap from the metal member 50. That is, a space is provided between the metal member 50 and the mold bus bar 40.

The terminal portion 33 of the power semiconductor module 30 is inserted through the opening 51 of the metal member 50 and extends upward. Although not illustrated, the gate terminals 111 and 121, the emitter terminals 112 and 122, and the signal terminals 113 and 123 to 125, which are signal terminals of the terminal portion 33, are connected to a wiring (not shown) provided on the control circuit board 70 via the board base 81. The DC positive-side terminal 101 and the DC negative-side terminal 103, which are power supply terminals, and the AC output terminal 102, which is an output terminal, of the terminal portion 33 are connected to the mold bus bar 40.

Figure 8:
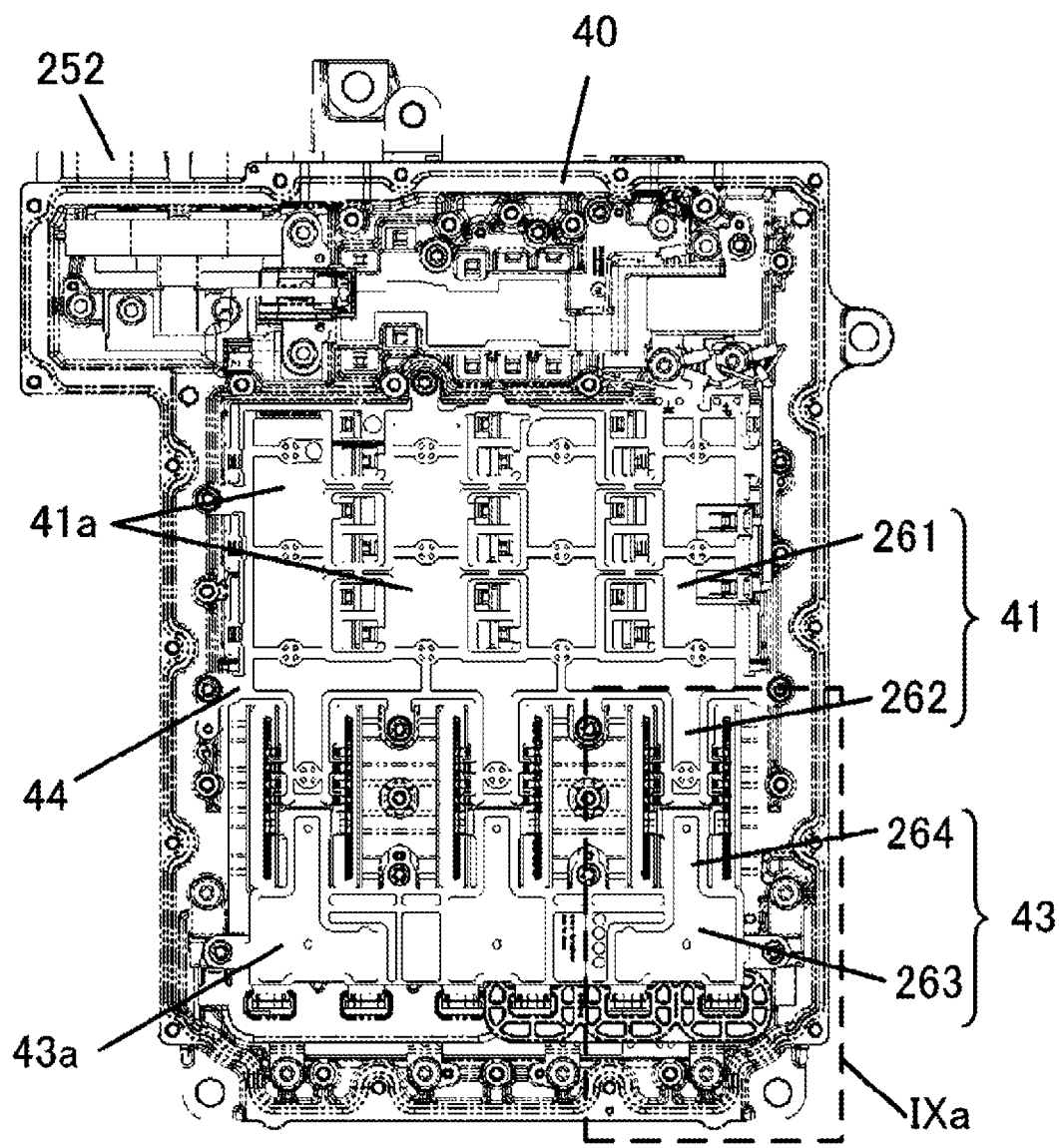
FIG. 8 is a plan view of FIG. 4 as viewed from above the case.
Figure 9A:
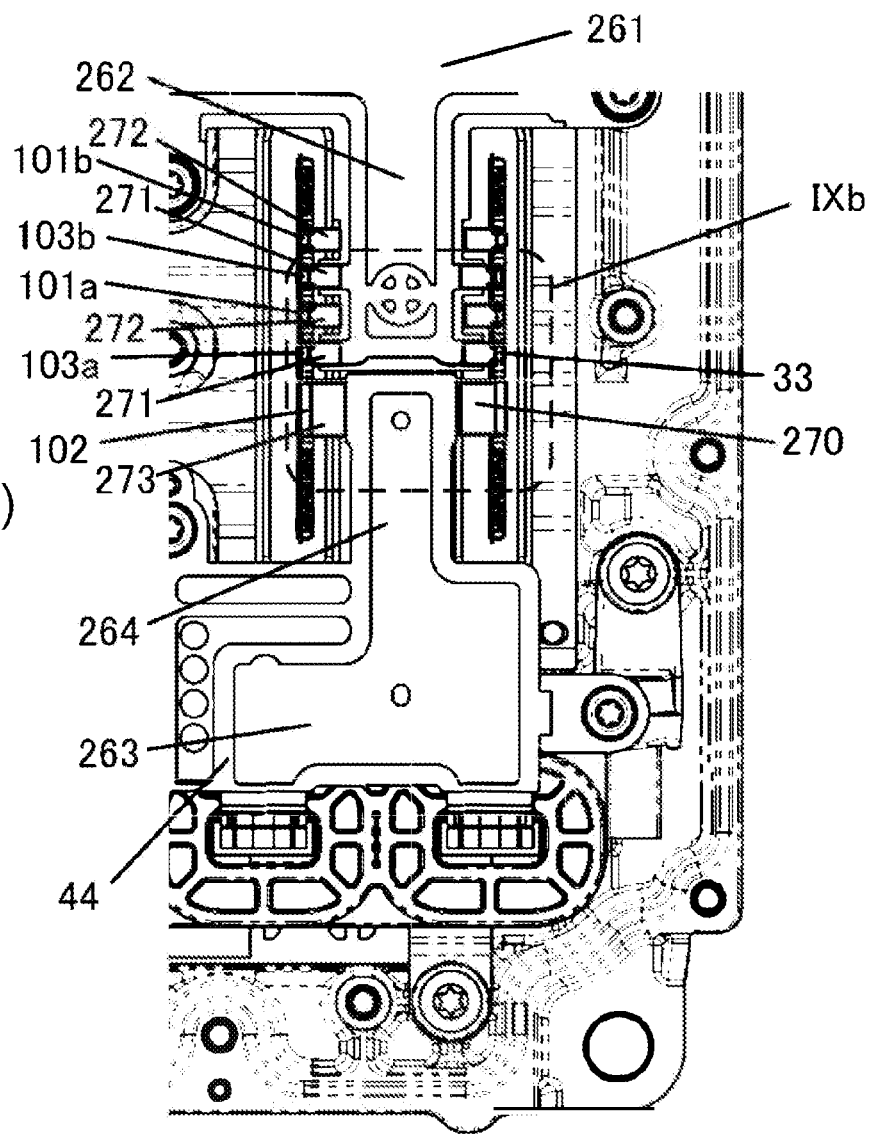
FIG. 9(A) is an enlarged view of a region IXa in FIG. 8.
Figure 9B:
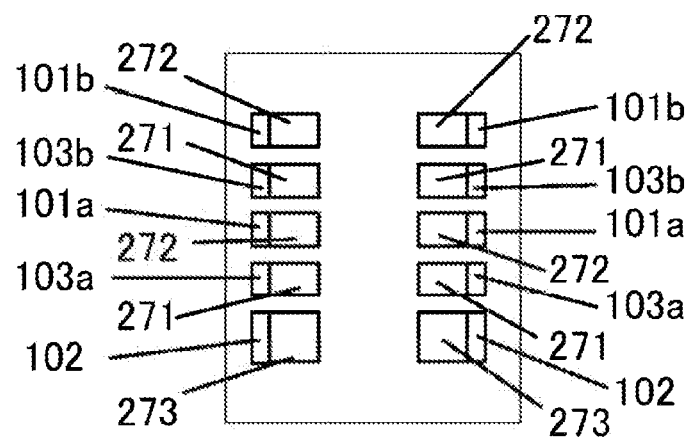
FIG. 9(B) is a schematic view illustrating arrangement of terminals of the power semiconductor module 30 and terminal portions of bus bars in a region IXb in FIG. 9(A).

FIG. 8 is a plan view of FIG. 4 as viewed from above the case, FIG. 9(A) is an enlarged view of a region IXa of FIG. 8, and FIG. 9(B) is a schematic view showing the arrangement of the terminals of the power semiconductor module 30 and the terminal portion of the bus bars in a region IXb of FIG. 9(A).

As illustrated in FIG. 8, the power semiconductor modules 30 are arranged as a pair facing each other with the partition portion 252b (see FIG. 6) of the case 252 sandwiched between them, and three semiconductor module pairs are housed in the semiconductor module housing portion 601.

The negative-side bus bar 41 has a main body portion 261 extending on the capacitor module 500 and an extending portion 262 extending between the power semiconductor modules 30 of each pair of the power semiconductor modules 30. A pair of the power semiconductor modules 30 are disposed close to each other, and a distance between a pair of the power semiconductor modules 30 is small. For this reason, the width of the extending portion 262 (the length in the direction orthogonal to the extending direction) is smaller than the width of the main body portion 261.

Although not illustrated, the positive-side bus bar 42 has a similar configuration and includes a main body portion extending on the capacitor module 500 and an extending portion extending between the power semiconductor modules 30 of each pair of the power semiconductor modules 30 and having the width smaller than that of the main body portion.

Further, the AC-side bus bar 43 also includes an extending portion 264 extending between the power semiconductor modules 30 of each pair of the power semiconductor modules 30 and a main body portion 263 provided on the outside of a space between the power semiconductor modules 30 of each pair of the power semiconductor modules 30.

As shown in FIGS. 9(A) and 9(B), two pairs of negative-side terminal portions 271 are formed on the negative-side bus bar 41, and two pairs of positive-side terminal portions 272 are formed on the positive-side bus bar 42. Two pairs of the negative-side terminal portions 271 are connected to the branch terminals 103a and 103b of the DC negative-side terminal 103 of the power semiconductor module 30, for example, by welding. Two pairs of the positive-side terminal portions 272 are connected to the branch terminals 101a and 101b of the DC positive-side terminal 101 of the power semiconductor module 30, for example, by welding.

Further, a pair of AC-side terminal portions 273 are formed on the AC-side bus bar 43. A pair of the AC-side terminal portions 273 are joined to the AC output terminal 102 of the power semiconductor module 30 by welding, for example.

Two pairs of the negative-side terminal portions 271, the positive-side terminal portions 272, and the AC-side terminal portions 273 constitute the connection terminal portion 270 of the mold bus bar 40. A housing space for housing the terminal portions 271, 272, and 273 is provided in the insulating material 46 (see FIG. 3), and each of the terminal portions 271, 272, and 273 of each of the connection terminal portions 270 is covered by the insulating material 46 in a state of being housed in the housing space of the insulating material 46.

A connection structure between the mold bus bar 40 and the terminal portion 33 of the power semiconductor module 30 will be described with reference to FIG. 6. Hereinafter, as a representative, a connection structure between the negative-side bus bar 41 and the branch terminal 103a of the DC negative-side terminal 103 of the power semiconductor module 30 will be described. However, hereinafter, the branch terminal 103a will be simply referred to as the DC negative-side terminal 103.

The negative-side terminal portions 271 of the negative-side bus bar 41 are exposed from the resin portion 44 in an end portion in the width direction (a direction orthogonal to the extending direction) of the extending portion 262, and are bent in a tilting direction in a root portion 275. The negative-side terminal portion 271 is connected to the DC negative-side terminal 103 of the power semiconductor module 30 in a tip portion.

Note that, in the above description, the connection structure between the negative-side terminal portion 271 of the negative-side bus bar 41 and the branch terminal 103a of the DC negative-side terminal 103 of the power semiconductor module 30 is described. However, the joint structure between the negative-side terminal portion 271 of the negative-side bus bar 41 and the branch terminal 103b of the DC negative-side terminal 103 is also the same as described above. Further, the connection structure between the positive-side terminal portion 272 of the positive-side bus bar 42 and the branch terminal 101a and the branch terminal 101b of the DC positive-side terminal 101 of the power semiconductor module 30, and the connection structure between the AC-side terminal portion 273 of the AC-side bus bar 43 and the AC output terminal 102 of the power semiconductor module 30 shown in FIG. 9(B) are also the same as those described above.

In the partition portion 252b of the case 252, a protruding portion 281 protruding toward the mold bus bar 40 further than an upper surface 257 of the power semiconductor module 30 is formed. A gap is provided between the metal member 50 and the mold bus bar 40, and in FIG. 6, the protruding portion 281 is illustrated as protruding further than an upper surface of the metal member 50. However, the protruding portion 281 does not need to protrude further than the upper surface of the metal member 50.

A heat conductive material 282 such as heat conductive grease or sheet is interposed between the protruding portion 281 and mold bus bar 40, and the case 252 and the mold bus bar 40 are heat-conductively coupled, that is, thermally coupled. The protruding portion 281 is disposed between a pair of the power semiconductor modules 30 disposed with the partition portion 252b sandwiched between them. Note that the thermal coupling between the protruding portion 281 and the mold bus bar 40 may have a structure in which the protruding portion 281 and the mold bus bar 40 are brought into direct contact with each other without the heat conductive material 282 interposed between them.

Figure 11:
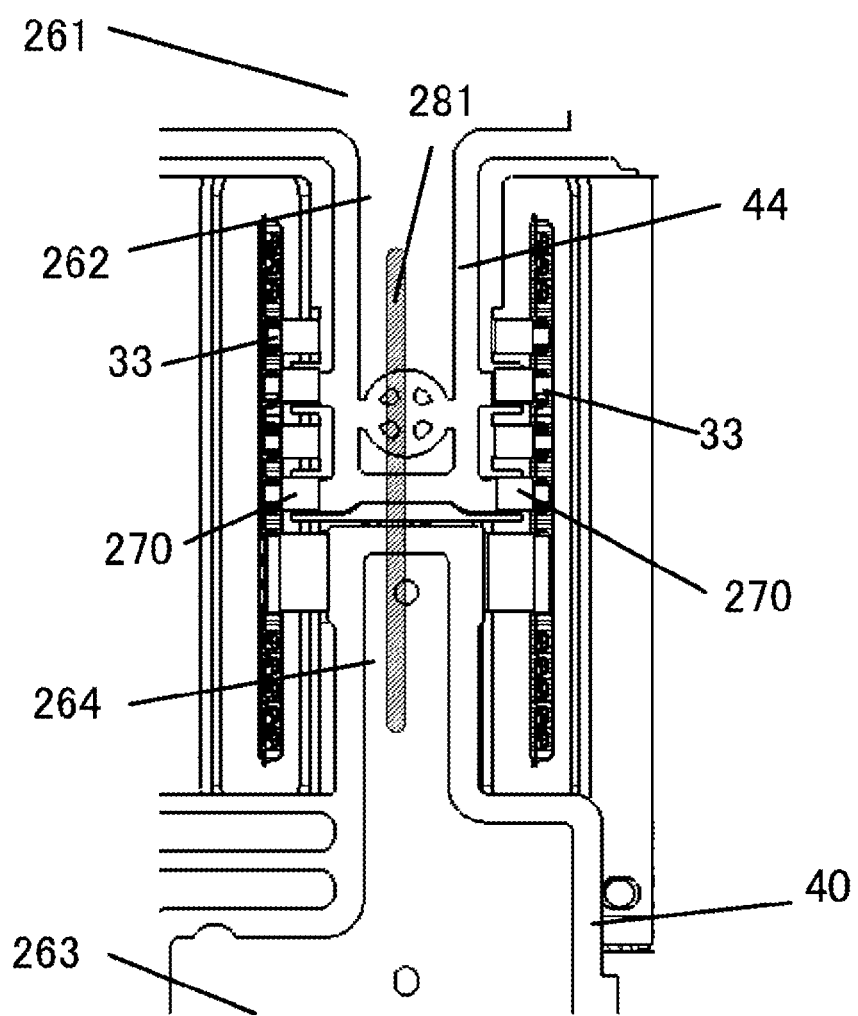
FIG. 11 illustrates a main part of FIG. 9(A), and is a diagram for explaining a position on a plane of a protruding portion of the power semiconductor module.

FIG. 11 illustrates a main part of FIG. 9(A), and is a diagram for explaining a position on a plane of the protruding portion of the power semiconductor module.

As illustrated in FIG. 11, the protruding portion 281 of the power semiconductor module 30 extends in parallel with the terminal portion 33 between the terminal portion 33 of one of the power semiconductor modules 30 and the terminal portion 33 of the other one of the power semiconductor modules 30, and is disposed to overlap the extending portion 262 of the negative-side bus bar 41 and the extending portion 264 of the AC-side bus bar 43 in plan view.

In the power conversion device 200, the power semiconductor module 30 has a high temperature due to heat generation of the power semiconductor elements such as the IGBTs 328 and 330, and is thermally conducted to the capacitor module 500 via the mold bus bar 40. For this reason, there is possibility that the temperature of the capacitor elements 501 of the capacitor module 500 increases to exceed the heat-resistant temperature.

The present exemplary embodiment has a structure in which a spatial distance and a creepage distance between the case 252 and the mold bus bar 40 are made large, so that heat transmitted to the capacitor module 500 can be suppressed.

This will be described below.

Figure 10:
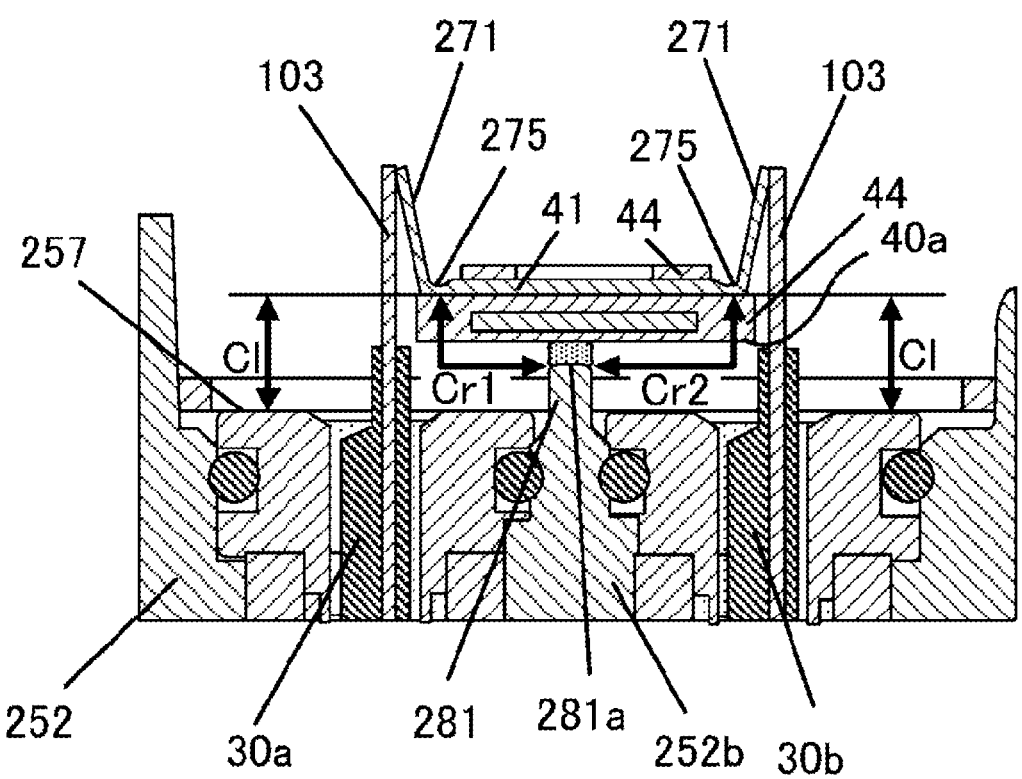
FIG. 10 illustrates a main part of FIG. 6, and is a diagram for explaining a spatial distance and a creepage distance in the present embodiment.

FIG. 10 illustrates a main part of FIG. 6, and is a diagram for explaining a spatial distance and a creepage distance in the present embodiment.

Note that, in FIG. 10, the power semiconductor module on the left side is referred to as a first power semiconductor module 30a, and the power semiconductor module on the right side is referred to as a second power semiconductor module 30b.

The protruding portion 281 is provided at an upper end of the partition portion 252b of the case 252. An upper surface 281a of the protruding portion 281 protrudes toward the mold bus bar 40 further than the upper surfaces 257 of the first and second power semiconductor modules 30b. Therefore, a spatial distance Cl between the root portion 275 where the negative-side terminal portion 271 is exposed from the resin portion 44 of the mold bus bar 40 and each of the first and second power semiconductor modules 30a and 30b is larger than the spatial distance in the case of the structure in which the mold bus bar 40 is directly disposed on the upper surface 257 of the power semiconductor module 30 by the protruding portion 281 protruding from the upper surface 257 of each of the first and second power semiconductor modules 30b.

Further, as illustrated in FIG. 10, the protruding portion 281 provided on the partition portion 252b of the case 252 is disposed between the first power semiconductor module 30a and the second power semiconductor module 30b. The creepage distance is the sum of a horizontal distance along a lower surface 40a of the mold bus bar 40 from the protruding portion 281 to the root portion 275 of the negative-side terminal portion 271 and a distance in a direction orthogonal to the horizontal direction. In the present embodiment, the protruding portion 281 is located between the second DC negative-side terminal 103 of the first power semiconductor module 30a and the DC negative-side terminal 103 of the second power semiconductor module 30b. Therefore, the distance in the horizontal direction of the creepage distance is not zero. In contrast, in the structure in which the mold bus bar 40 is directly disposed on the upper surface 257 of the power semiconductor module 30, the distance in the horizontal direction of the creepage distance is substantially zero.

Therefore, a creepage distance Cr1 from the protruding portion 281 of the case 252 to the root portion 275 of the negative-side terminal portion 271 of the first power semiconductor module 30a is larger than the creepage distance in the case of the structure in which the mold bus bar 40 is directly disposed on the upper surface 257 of the power semiconductor module 30. Further, a creepage distance Cr2 from the protruding portion 281 of the case 252 to the root portion 275 of the negative-side terminal portion 271 of the second power semiconductor module 30b is larger than the creepage distance in the case of the structure in which the mold bus bar 40 is directly disposed on the upper surface 257 of the power semiconductor module 30.

As described above, in the power conversion device 200 according to the embodiment of the present invention, the spatial distance and the creepage distance between the root portion 275 where the negative-side terminal portion 271 of the mold bus bar 40 is exposed from the resin portion 44 and the power semiconductor module 30 can be made large as compared with those in the conventional structure. For this reason, the heat transferred from the power semiconductor module 30 to the mold bus bar 40 can be reduced. In this manner, the amount of heat transferred from the power semiconductor module 30 to the capacitor element 501 through the mold bus bar 40 is reduced, and the capacitor element 501 can be prevented from having a high temperature.

The protruding portion 281 is preferably disposed near the center between the DC negative-side terminal 103 of the first power semiconductor module 30a and the DC negative-side terminal 103 of the second power semiconductor module 30b. This is because the creepage distance Cr1 between the protruding portion 281 of the case 252 and the root portion 275 of the negative-side terminal portion 271 of the first power semiconductor module 30a can be made substantially equal to the creepage distance Cr2 between the protruding portion 281 of the case 252 and the root portion 275 of the negative-side terminal portion 271 of the second power semiconductor module 30b. However, as long as the creepage distance Cr1 and the creepage distance Cr2 satisfy the creepage distance defined, for example, in the international standard such as IEC60243-1, the position of the protruding portion 281 does not need to be in the vicinity of the center between the DC negative-side terminal 103 of the first power semiconductor module 30a and the DC negative-side terminal 103 of the second power semiconductor module 30b.

Further, the position of the upper surface 281a of the protruding portion 281 is preferably set such that the spatial distance C1 from the root portion 275 of the negative-side terminal portion 271 to the upper surface 257 of the power semiconductor module 30 also satisfies the spatial distance defined in the international standard such as IEC60243-1.

Note that, in the above description, the connection structure between the DC negative-side terminal 103 of the power semiconductor module 30 and the negative-side terminal portion 271 of the negative-side bus bar 41 is exemplified. However, the same applies to a connection structure between the DC positive-side terminal 101 of the power semiconductor module 30 and the positive-side terminal portion 272 of the positive-side bus bar 42, and a connection structure between the AC-side terminal portion 273 of the AC-side bus bar 43 and the AC output terminal 102 of the power semiconductor module 30.

Figure 12:
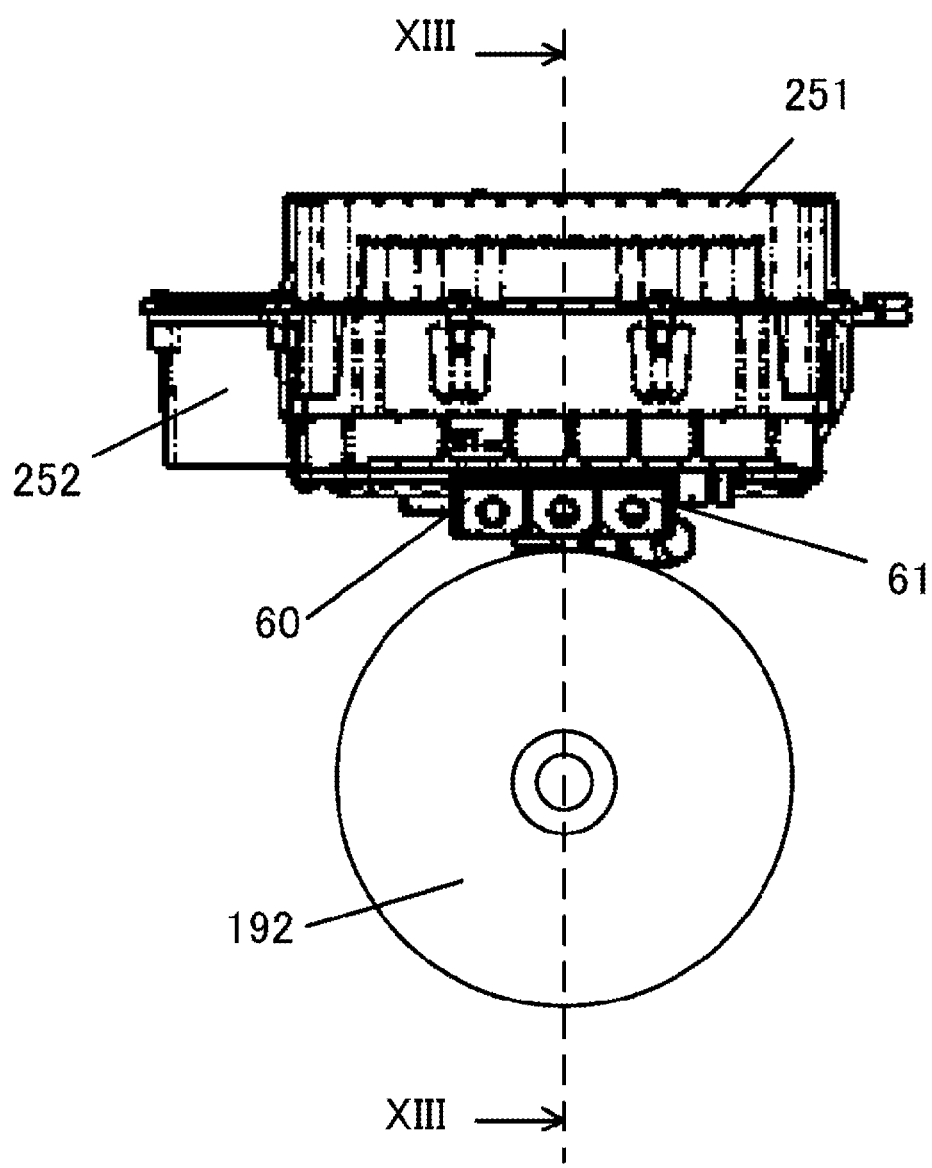
FIG. 12 is a plan view of mounting structure of the power conversion device and a motor generator.
Figure 13:
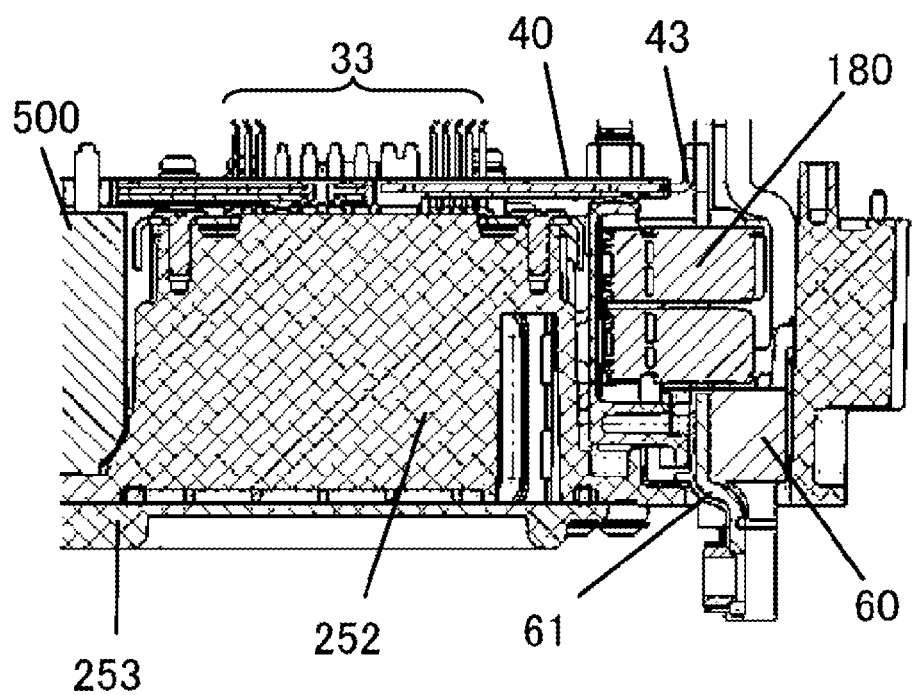
FIG. 13 is a cross-sectional view taken along line XIII-XIII of FIG. 12.

FIG. 12 is a plan view of a mounting structure of the power conversion device and the motor generator, and FIG. 13 is a cross-sectional view taken along line XIII-XIII of FIG. 12. However, the motor generator is not illustrated in FIG. 12. Note that, hereinafter, description will be made with reference to FIGS. 3 to 5.

The current sensor 180 and the AC terminal member 60 are attached to a side portion on the side where the semiconductor module housing portion 601 is formed of the case 252. A plurality of the relay AC bus bars 61 are attached to the AC terminal member 60. The relay AC bus bar 61 corresponds to the relay AC connection conductor 241 of FIG. 1.

The relay AC bus bar 61 is electrically connected to the motor generator 192. The relay AC bus bar 61 is inserted in the vicinity of the current sensor 180 and connected to the AC-side bus bar 43. The AC terminal member 60 to which the relay AC bus bar 61 is attached is heat-conductively coupled, that is, thermally coupled to the case 252.

The motor generator 192 generates large heat when driven. The heat generated by the motor generator 192 is thermally conducted to the mold bus bar 40 via the relay AC bus bar 61. When the temperature of the relay AC bus bar 61 becomes high, heat is conducted via the AC-side bus bar 43, and electronic components in the power conversion device 200 such as the capacitor module 500 become high temperature.

In the present embodiment, since the relay AC bus bar 61 is thermally coupled to the case 252, the relay AC bus bar 61 is cooled by the cooling structure to which the refrigerant is supplied via the case 252, and it is possible to prevent the electronic components in the power conversion device 200 such as the capacitor module 500 connected to the mold bus bar 40 from becoming high temperature.

According to an embodiment of the present invention, effects described below are obtained.

(1) The power conversion device 200 includes the capacitor module 500, the first and second power semiconductor modules 30, the case 252 having the capacitor module housing portion 602 and the semiconductor module housing portion 601, and the mold bus bar 40 having the resin portion 44 and the negative-side bus bar 41. The negative-side bus bar 41 includes a capacitor connection portion connected to the capacitor element 501 constituting the capacitor module 500, and the first negative-side terminal portion 271 connected to the DC negative-side terminal 103 of the first power semiconductor module 30 and the second negative-side terminal portion 271 connected to the negative-side terminal portion 271 of the second power semiconductor module 30, which are exposed from the resin portion 44. The partition portion 252b of the case 252 is provided with the protruding portion 281 that protrudes toward the mold bus bar 40 than the upper surfaces 257 of the first power semiconductor module 30 and the second power semiconductor module 30 and is thermally coupled to the mold bus bar 40. The protruding portion 281 is disposed between the root portion 275 of an exposed portion where the first negative-side terminal portion 271 is exposed from the resin portion 44 and the root portion 275 of an exposed portion where the second negative-side terminal portion 271 is exposed from the resin portion 44. For this reason, it is possible to make large a spatial distance and a creepage distance from the root portion 275 where the negative-side terminal portion 271 is exposed from the resin portion 44 of the negative-side bus bar 41 to the power semiconductor module 30. That is, it is possible to make large the spatial distance and the creepage distance between the exposed portion from the resin portion 44 of the mold bus bar 40 and the power semiconductor module 30 to suppress the temperature rise of the capacitor. In this manner, heat transmitted from the power semiconductor module 30 to the mold bus bar 40 is reduced, and the capacitor element 501 connected to the mold bus bar 40 can be prevented from becoming high temperature.

(2) A space is provided between the upper surface 257 of the power semiconductor module 30 and the mold bus bar 40. In this manner, it is possible to make large a spatial distance and a creepage distance from the root portion 275 where the negative-side terminal portion 271 is exposed from the resin portion 44 to the power semiconductor module 30.

(3) The mold bus bar 40 includes the AC-side bus bar 43, and the protruding portion 281 overlaps with a part of the AC-side bus bar 43 in plan view from above the protruding portion 281. As described above, the AC-side terminal portion 273 of the AC-side bus bar 43 is also formed in a similar manner to the negative-side terminal portion 271 of the negative-side bus bar 41. For this reason, heat transmitted from the power semiconductor module 30 to the AC-side bus bar 43 of the mold bus bar 40 is reduced, and the capacitor element 501 connected to the mold bus bar 40 can be prevented from becoming high temperature.

(4) The relay AC bus bar 61 connected to the AC-side bus bar 43 is further included, and the relay AC bus bar 61 is thermally coupled to the case 252. For this reason, heat generated by an external device such as the motor generator 192 and the like connected to the relay AC bus bar 61 is cooled by the cooling structure via the case 252 to which the relay AC bus bar 61 is thermally coupled, and it is possible to prevent the electronic components in the power conversion device 200 such as the capacitor module 500 connected to the mold bus bar 40 from becoming high temperature.

Note that, the embodiment described above exemplifies the mold bus bar 40 in which the positive-side and negative-side bus bars 42, 41 and the AC-side bus bar 43 are insert-molded in the resin portion 44. However, instead of insert molding, the positive-side and negative-side bus bars 42 and 41 and the AC-side bus bar 43 may be fixed to the resin portion 44 by fastening members such as a screw and a pin.

In the above embodiment, the power conversion circuit including six of the power semiconductor modules 30 having a function as a three-phase arm circuit is exemplified. However, the present invention can be applied to the power conversion device 200 including one of the power semiconductor module 30 or three of the power semiconductor modules 30.

In the above embodiment, the inverter device using the IGBTs 328 and 330 is exemplified as the power conversion device 200. However, the present invention can also be applied to an inverter circuit using a thyristor, a gate turn off thyristor (GTO), or the like instead of the IGBTs 328 and 330.

Further, the present invention is not limited to an inverter device that performs DC-AC conversion, and can also be applied to other power conversion devices such as a matrix converter that performs AC-AC conversion.

The present invention is not limited to the above embodiments. Other modes considered within the scope of the technical idea of the present invention are also included in the scope of the present invention.

REFERENCE SIGNS LIST 30 power semiconductor module
30a first power semiconductor module
30b second power semiconductor module
40 mold bus bar (connection member)
41 negative-side bus bar (connection conductor)
42 positive-side bus bar (connection conductor)
43 AC-side bus bar (connection conductor)
44 resin portion
50 metal member
200 power conversion device
211 DC negative-side connection conductor
221 DC positive-side connection conductor
231 AC output-side connection conductor
241 relay AC connection conductor
252 case
252b partition portion
257 upper surface (one surface)
271 negative-side terminal portion
272 positive-side terminal portion
273 AC-side terminal portion
275 root portion
281 protruding portion
500 capacitor module
501 capacitor element (capacitor)
601 semiconductor module housing portion
602 capacitor module housing portion
C1 spatial distance
Cr1 creepage distance
Cr2 creepage distance

The invention claimed is:

1. A power conversion device comprising:
a capacitor;
a first power semiconductor module and a second power semiconductor module each having an input terminal or an output terminal protruding from one surface;
a case including a capacitor housing portion that houses the capacitor, a semiconductor module housing portion that houses the first power semiconductor module and the second power semiconductor module, and a partition portion provided between the first power semiconductor module and the second power semiconductor module; and
a connection member in which a resin portion and a connection conductor are integrally provided and which is disposed on the one surface of the first power semiconductor module and the second power semiconductor module, wherein
the connection conductor includes a capacitor connection portion connected to the capacitor, a first terminal portion exposed from the resin portion and connected to the terminal of the first power semiconductor module, and a second terminal portion connected to the terminal of the second power semiconductor module,
the partition portion of the case is provided with a protruding portion that protrudes toward the connection member further than the one surface of the first power semiconductor module and the second power semiconductor module and is thermally coupled to the connection member, and the protruding portion is thermally coupled to the connection member and disposed between a first root portion of an exposed portion where the first terminal portion is exposed from the resin portion and a second root portion of an exposed portion where the second terminal portion is exposed from the resin portion.

2. The power conversion device according to claim 1, wherein a space is provided between the one surface of the first power semiconductor module and the second power semiconductor module and the connection member.

3. The power conversion device according to claim 2, further comprising
a metal member provided on the one surface of the first power semiconductor module and the second power semiconductor module, wherein
the space is provided between the metal member and the connection member.

4. The power conversion device according to claim 1, wherein
the connection conductor includes a DC positive-side connection conductor and a DC negative-side connection conductor, and
the protruding portion overlaps with a part of the DC positive-side connection conductor or a part of the DC negative-side connection conductor in plan view from above the protruding portion.

5. The power conversion device according to claim 1, wherein
the connection conductor includes an AC output-side connection conductor, and
the protruding portion overlaps with a part of the AC output-side connection conductor in plan view from above the protruding portion.

6. The power conversion device according to claim 5, further comprising
a relay AC connection conductor connected to the AC output-side connection conductor, wherein
the relay AC connection conductor is thermally coupled to the case.

7. A manufacturing method of a power conversion device, the manufacturing method comprising:
housing a capacitor in a capacitor housing portion of a case, and housing, on both sides of a partition portion of the case, a first power semiconductor module and a second power semiconductor module each having an input terminal or an output terminal protruding from one surface in a semiconductor module housing portion of the case provided with the partition portion; and
disposing, on the one surface of the first power semiconductor module and the second power semiconductor module, a connection member in which a resin portion and a connection conductor are integrally provided, and the connection conductor has a capacitor connection portion connected to the capacitor and has a first terminal portion exposed from the resin portion and connected to the terminal of the first power semiconductor module and a second terminal portion connected to the terminal of the second power semiconductor module, wherein
the partition portion is provided with a protruding portion that protrudes toward the connection member further than the one surface of the first power semiconductor module and the second power semiconductor module and is thermally coupled to the connection member, and
the disposing the connection member on the one surface of the first power semiconductor module and the second power semiconductor module includes disposing the protruding portion between a first root portion of an exposed portion where the first terminal portion is exposed from the resin portion and a second root portion of an exposed portion where the second terminal portion is exposed from the resin portion, and thermally coupling the protruding portion to the connection member.

* * * * *